United States Patent
Senoo

(10) Patent No.: US 9,412,809 B2
(45) Date of Patent: Aug. 9, 2016

(54) SEMICONDUCTOR DEVICE AND MANUFACTURING METHOD THEREOF

(71) Applicant: Masaru Senoo, Okazaki (JP)

(72) Inventor: Masaru Senoo, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/766,307

(22) PCT Filed: Feb. 15, 2013

(86) PCT No.: PCT/JP2013/053724
§ 371 (c)(1),
(2) Date: Aug. 6, 2015

(87) PCT Pub. No.: WO2014/125626
PCT Pub. Date: Aug. 21, 2014

(65) Prior Publication Data
US 2015/0364541 A1    Dec. 17, 2015

(51) Int. Cl.
| | |
|---|---|
| *H01L 29/06* | (2006.01) |
| *H01L 29/40* | (2006.01) |
| *H01L 29/739* | (2006.01) |
| *H01L 21/765* | (2006.01) |
| *H01L 21/266* | (2006.01) |

(Continued)

(52) U.S. Cl.
CPC .......... *H01L 29/0623* (2013.01); *H01L 21/765* (2013.01); *H01L 29/0619* (2013.01); *H01L 29/402* (2013.01); *H01L 29/404* (2013.01); *H01L 29/405* (2013.01); *H01L 29/7397* (2013.01); *H01L 21/266* (2013.01); *H01L 29/1095* (2013.01); *H01L 29/861* (2013.01)

(58) Field of Classification Search
CPC . H01L 29/0623; H01L 21/765; H01L 29/402; H01L 29/7397; H01L 29/0619; H01L 29/404; H01L 29/405; H01L 29/1095; H01L 29/861; H01L 21/26
See application file for complete search history.

(56) References Cited

U.S. PATENT DOCUMENTS 5,552,625 A * 9/1996 Murakami .......... H01L 29/0626
                                                    257/409
5,804,868 A * 9/1998 Kobayashi .......... H01L 29/0619
                                                    257/630

(Continued)

FOREIGN PATENT DOCUMENTS

| JP | H11-330496 A | 11/1999 |
|---|---|---|
| JP | 2000-114549 A | 4/2000 |

(Continued)

*Primary Examiner* — Victor A Mandala
(74) *Attorney, Agent, or Firm* — Oliff PLC

(57) ABSTRACT

Provided is a semiconductor device in which movable ions in an insulation layer on a main surface are reduced and dielectric strength is enhanced. A semiconductor device has a plurality of FLRs, an insulation layer, and a semiconductor layer. The plurality of FLRs surrounds, in a plan view of a substrate, an active region in which an element is formed. The insulation layer is provided on the main surface of the semiconductor device and covers the plurality of FLRs. The semiconductor layer is provided in the insulation layer and surrounds the active region in parallel to the FLRs. The semiconductor layer contains impurities at a surface density lower than a surface density that satisfies a RESURF condition. In the plan view, the semiconductor layer overlaps with a part of the region (an inter-ring region) between adjacent FLRs and does not overlap with rest of the inter-ring region.

6 Claims, 11 Drawing Sheets

(51) Int. Cl.
*H01L 29/861* (2006.01)
*H01L 29/10* (2006.01)

(56) References Cited

U.S. PATENT DOCUMENTS

| | | | |
|---|---|---|---|
| 6,407,413 B1 | 6/2002 | Kawamoto | |
| 9,178,014 B2 * | 11/2015 | Senoo | H01L 29/404 |
| 2005/0056912 A1 | 3/2005 | Ninomiya et al. | |
| 2008/0135926 A1 * | 6/2008 | Ono | H01L 29/0615 |
| | | | 257/328 |
| 2008/0296587 A1 * | 12/2008 | Yamamoto | H01L 29/0619 |
| | | | 257/77 |
| 2010/0025820 A1 * | 2/2010 | Suekawa | H01L 29/0619 |
| | | | 257/584 |
| 2011/0115033 A1 * | 5/2011 | Tamaki | H01L 29/7395 |
| | | | 257/409 |
| 2012/0074489 A1 * | 3/2012 | Hsieh | H01L 29/7813 |
| | | | 257/330 |
| 2014/0374871 A1 | 12/2014 | Hirabayashi et al. | |

FOREIGN PATENT DOCUMENTS

| | | |
|---|---|---|
| JP | 2001-217420 A | 8/2001 |
| JP | 2005-093550 A | 4/2005 |
| JP | 2013-012568 A | 1/2013 |
| WO | 2013/105350 A1 | 7/2013 |

* cited by examiner

SEMICONDUCTOR DEVICE AND MANUFACTURING METHOD THEREOF

TECHNICAL FIELD

The present invention relates to a semiconductor device. The present specification relates to a semiconductor device having a field limiting ring, and provides a technique to enhance dielectric strength of a semiconductor device.

BACKGROUND ART

In a semiconductor device, an insulation zone called a depletion layer is formed at a p-n junction. When a width of the depletion layer is small, electric field strength in the depletion layer becomes high. When the electric field strength is too high, insulation breakdown occurs, which leads to damages in an element. It is known that the width of the depletion layer becomes narrow at an edge of an active region, and electric field strength becomes high therein.

As a technique to enhance dielectric strength of a semiconductor device, a field limiting ring (Field Limiting Ring: FLR) is known. Hereinafter, a field limiting ring is simply called "FLR" for simplicity of description. The FLR is a layer provided in a semiconductor substrate to surround an active region in which an element is formed, and has a conductivity type different from an inherent conductivity type of the substrate. The FLR is also called a floating diffusion layer. When using a semiconductor substrate of an N-type, for example, P-type impurities are provided in a ring shape surrounding an active region for doping, so that a P-type FLR is formed. When the FLR is provided, a depletion layer is formed and extends at the p-n junction between the FLR and the semiconductor substrate, and accordingly, dielectric strength is enhanced. Improvement of an FLR is disclosed in Japanese Patent Application Publication No. 2000-114549 (JP 2000-114549 A), for example.

SUMMARY OF INVENTION

It is generally known that dielectric strength is enhanced more by providing a plurality of FLRs having a small width than by providing one FLR having a great width. The term "width" here refers to a width of an FRL in a plan view of a semiconductor device. Hereinafter, the term "width" will be used in this meaning. When a plurality of FLRs is provided, an insulation zone is formed between adjacent FLRs. Because electric field strength in the insulation zone increases as the width of the insulation zone decreases, the distance between adjacent FLRs cannot be too small.

On the other hand, a main surface of a semiconductor device, including the FLRs, is covered with an insulation layer. When the insulation layer contains an excessive amount of movable ions, electric field distribution is disturbed and consequently the insulation layer is more easily destroyed. Although the movable ions are not the only factor to deteriorate the insulation layer, the movable ions will be referred herein as a typical factor to deteriorate the insulation layer.

Source of the movable ions is assumed to be contamination during fabrication of a semiconductor device as well as external contamination. To reduce the movable ions, a conductive layer or a semiconductor layer may be provided in an insulation layer so as to trap the movable ions. In the semiconductor layer, carriers capture the movable ions. However, the conductive layer or the semiconductor layer cannot be simply provided between adjacent FLRs because, as mentioned above, an insulation zone between adjacent FLRs needs to have a certain width. A reason for this is that neither the conductive layer nor the semiconductor layer containing the carriers forms an electric field therein and, as a result, the presence of the conductive layer or the semiconductor layer between the adjacent FLRs leads to a decrease in the width of an area where the electric field can be formed.

The present specification provides a technique to reduce movable ions in an insulation layer on a main surface and to enhance dielectric strength as well.

In a technique disclosed in the present specification, a semiconductor layer is provided in an insulation layer that covers a plurality of FLRs. The semiconductor layer is provided parallel to each FLR and surrounding an active region. In a plan view of a semiconductor substrate, the semiconductor layer overlaps a region between adjacent FLRs. Hereinafter, a region between adjacent FLRs is sometimes called an inter-ring region. It should be noted that the semiconductor layer does not overlap with the entire region between two FLRs. Instead, the semiconductor layer overlaps with a part of the region between two FLRs and does not overlap with rest of the region. In other words, in the plan view of the semiconductor substrate, a portion where the semiconductor layer overlaps with the inter-ring region surrounds the active region and, in parallel to this portion, another portion where the semiconductor layer does not overlap with the inter-ring region also surrounds the active region. One of the characteristics of the technique disclosed in the present specification is that the semiconductor layer contains activated impurities at a surface density (concentration) lower than a surface density (concentration) that satisfies a RESURF condition. The impurities are substances, typically boron or phosphorus, that determine the type of a semiconductor, namely, determines whether the semiconductor layer as a whole is of a P-type or an N-type.

The region where the semiconductor layer does not overlap with the inter-ring region always serves as an insulation zone, and an electric field extending from a depletion layer formed in the semiconductor substrate passes through the insulation zone. In a technique disclosed in the present specification, when voltage applied to the substrate increases, the depletion layer expands in the semiconductor layer next to the insulation zone, increasing the width of an area where the electric field can be formed and accordingly reducing electric field strength. The following describes the principle.

It is known that, when activated impurities at a surface density lower than the surface density that satisfies the RESURF condition are contained, the depletion layer is formed upon application of voltage. The surface density (concentration) that satisfies the RESURF condition is known to be about $1.0 \times E+12$ [atoms/cm$^2$] in terms of the surface density of an area on the surface of the semiconductor to be doped. For the details of the RESURF condition, see J. A. Apples, et al, Tech. Dig. IEDM 79, 238, 1979. Hereinafter, the surface density that satisfies the RESURF condition is sometimes called a "RESURF surface density" for convenience in description.

A semiconductor layer contains impurities at a certain surface density and, accordingly, contains carriers at a certain surface density. Because the carriers capture the movable ions, insulation breakdown caused by the movable ions is less likely to occur.

The following describes a reason why the dielectric strength is enhanced by the semiconductor layer with such a surface density provided above the inter-ring region in the insulation layer, with reference to FIG. 1A and FIG. 1B. FIG. 1A and FIG. 1B are sectional views of a semiconductor device 2 taken in a thickness direction. The semiconductor device 2 is a transistor having a semiconductor substrate 8 that includes a stacking of an N(−)-type drift layer 6 and an N(+)-type collector layer 7 and, in an active region of the semiconductor substrate 8, having a P-type body layer 53. Gates and the like are not shown in the drawings. It should be noted that, for the sake of clarity of the drawings, the drift layer 6 is shown with no hatching that indicates cross sections. Also in other drawings, the drift layer 6 has no hatching.

The semiconductor device 2 has three FLRs surrounding the active region in the plan view. The FLR closest to the active region is sometimes called a first FLR 14a, the FLR farthest therefrom is sometimes called a third FLR 14c, and the FLR in the middle is sometimes called a second FLR 14b. When no distinction is made among the three FLRs, the FLRs are sometimes called FLRs 14.

A peripheral area in a first main surface (the upper surface in the drawings) of the semiconductor device is covered with an insulation layer 5. In the insulation layer 5 above each FLR 14, a semiconductor layer 3 is provided. Each semiconductor layer 3 includes a low surface density region 3a that, in the plan view of the substrate, overlaps with a region (an inter-ring region Ra) between two adjacent FLRs and a high surface density region 3b that, in the plan view of the substrate, overlaps with the corresponding FLR 14. Seeing "in the plan view of the substrate" refers to seeing "the substrate in the thickness direction of the substrate". The expression "above the FLRs 14" refers to a direction from the FLRs 14 toward the insulation layer 5.

The high surface density regions 3b contain impurities at a surface density higher than a RESURF surface density, while the low surface density regions 3a contain impurities at a surface density lower than the RESURF surface density. These impurities may be of a P-type or an N-type provided that the semiconductor layer as a whole has a single conductivity type. When voltage is applied across a first main electrode 52 and a second main electrode 54 while applying no voltage to a gate of the transistor, a depletion layer is formed and extends along a surface of a body layer 53 and the surface of the first FLR 14a. In the drawings, equipotential lines are shown as dashed lines, and the equipotential lines in the drift layer 6 correspond to the depletion layer. The equipotential lines extend through the insulation layer 5 and beyond the semiconductor device 2.

FIG. 1A shows the equipotential lines when low voltage is applied across the main electrodes. FIG. 1B shows the equipotential lines when high voltage is applied across the main electrodes. When the voltage across the main electrodes is low (FIG. 1A), both of the low surface density regions 3a and the high surface density regions 3b of the semiconductor layer 3 contain carriers and therefore the entire semiconductor layer 3 constitutes a conductor. Accordingly, the low surface density regions 3a and the high surface density regions 3b are equal in potential. Therefore, the electric field extending from the depletion layer formed in the drift layer 6 does not extend into the low surface density regions 3a but extends within a range W1 where the semiconductor layer 3 (the semiconductor layer 3 including the low surface density regions 3a) is not present. In other words, in the inter-ring region Ra, the electric field extending from the depletion layer formed in the drift layer 6 is formed only within the range W1. Although the range W1 is narrow, the voltage across the range W1 is low and accordingly electric field strength in the range W1 is low. Therefore, no insulation breakdown occurs. In addition, the low surface density regions 3a, when containing the carriers, can trap movable ions. The high surface density regions 3b always contain the carriers and therefore trap the movable ions.

As the voltage across the main electrodes increases, the depletion layer is also formed in the low surface density regions 3a. As a result, the low surface density regions 3a become insulated and then the electric field is also formed inside the low surface density regions 3a. The depletion layer, at the maximum, grows throughout the entire low surface density regions 3a. When this occurs, the electric field is formed within a range W2 that corresponds to part of the inter-ring region Ra including the low surface density regions 3a. In other words, in the inter-ring region Ra, the range W2 is where the electric field extending from the depletion layer formed in the drift layer 6 passes through. As the state shown in FIG. 1A shifts to the state shown in FIG. 1B, the range in the inter-ring region Ra where the electric field can be formed expands from W1 to W2, mitigating an increase in the electric field strength. The description above may be summarized as follows. When the voltage applied to the semiconductor device increases, a depletion layer, or an insulation zone, extends into a low surface density region 3a of a semiconductor layer 3 overlapping with an inter-ring region, mitigating an increase in electric field strength.

The inter-ring region Ra has a portion where, in the plan view of the substrate, the semiconductor layer 3 does not overlap with the inter-ring region Ra, namely, a portion that always constitutes an insulation zone. The range W1 in FIG. 1A corresponds to this portion that always constitutes an insulation zone. With the presence of the insulation zone, the electric field can always be formed between the first FLR 14a and the second FLR 14b. In other words, a part of the electric field extending from the depletion layer formed in the drift layer 6 can be handled in between the first FLR 14a and the second FLR 14b.

The same phenomenon occurs between the second FLR 14b and the third FLR 14c. Between the second FLR 14b and the third FLR 14c, the same phenomenon as described above occurs, mitigating an increase in the electric field strength between these FLRs.

In the embodiment shown in FIGS. 1A and 1B, the surface density in each semiconductor layer 3 changes step-wise from the high surface density region 3b to the low surface density region 3a. Alternatively, the surface density of impurities may change gradually in each semiconductor layer so that the surface density of impurities in a portion facing an FLR is higher than the RESURF surface density, and then may decrease toward an end part of the semiconductor layer 3, with the surface density being lower than the RESURF surface density at some midpoint thereof. In such a configuration, the depletion layer expands within the semiconductor layer depending on the voltage applied to the semiconductor device, mitigating the increase in the electric field strength within the inter-ring region.

The same advantage can also be obtained by providing a semiconductor layer that contains impurities at a surface density lower than the RESURF surface density and another semiconductor layer that contains impurities at a higher surface density. The same advantage can still be obtained by providing a semiconductor layer that contains impurities at a surface density lower than the RESURF surface density and a conductive layer. In other words, the same advantage can also be obtained when the high surface density region 3b in FIG. 1A and FIG. 1B is constituted by a semiconductor layer that is provided independently of the low surface density region 3a, and alternatively, the same advantage can still be obtained when the high surface density region 3b is replaced with a conductor. When a conductive layer independent of a semiconductor layer is provided in an insulation layer, the following configuration is preferably adopted. The conductive layer provided in the insulation layer faces one FLR (the first FLR 14a in FIG. 1A, for example) and surrounds the active region. In the width direction, an edge of the semiconductor layer is closer to the adjacent FLR (the second FLR 14b in FIG. 1A, for example) than an edge of the FLR (the first FLR 14a) is, and is closer to the adjacent FLR than an edge of the conductive layer is. The semiconductor layer present between the end of the conductive layer and the adjacent FLR corresponds to the low surface density region 3a in FIG. 1A and FIG. 1B. In addition, the conductive layer traps movable ions in the insulation layer and prevents deterioration of the insulation layer.

The lower limit to the surface density of impurities in the low surface density region in the semiconductor layer may be $1.0 \times E-6$ [atoms/cm$^2$], which generally draws a boundary between a semiconductor and a non-conductor (an insulator). The low surface density region is required to have characteristics that carriers are present therein and a depletion layer is formed and expands therein upon application of a certain amount of voltage. Various combinations of a low surface density region, a high surface density region, and a conductive layer will be described in detail in the following embodiment section.

The conductive layer described above may be metal, or may be a layer in which polysilicon is doped with an excessive amount of impurities to resemble a conductor. Such a layer is also used as a gate of a semiconductor element. Therefore, the semiconductor layer in the insulation layer described above can be formed simultaneously with steps in conventional manufacturing method of a semiconductor device, without requiring another step dedicated to formation of the layer. Specifically, the conductive layer can be formed simultaneously with formation of a gate on a substrate. In addition, a polysilicon layer as a base of the semiconductor layer described above can also be formed simultaneously with formation of a polysilicon layer as a base of a temperature-sensing element on a substrate. The method of manufacturing such a semiconductor device is one of the novel methods disclosed in the present specification.

The details and further modifications of techniques disclosed in the present specification will be described in the following embodiment section.

DESCRIPTION OF EMBODIMENTS

First Embodiment

Figure 1A:
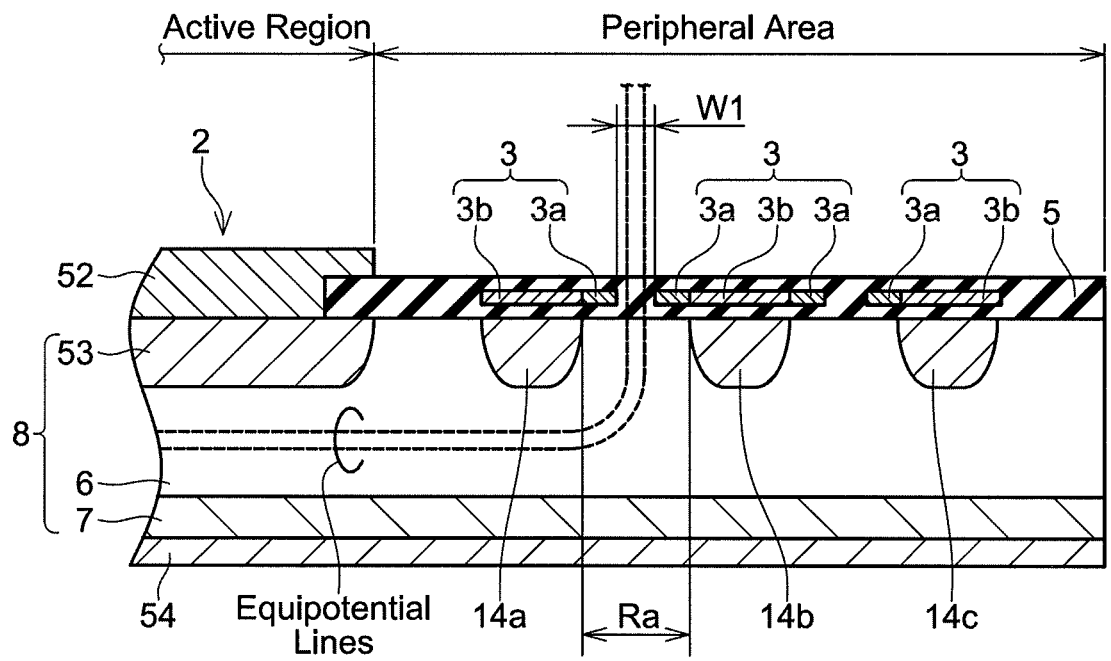
FIG. 1A is a sectional view of a semiconductor device (showing equipotential lines at a low voltage)
Figure 1B:
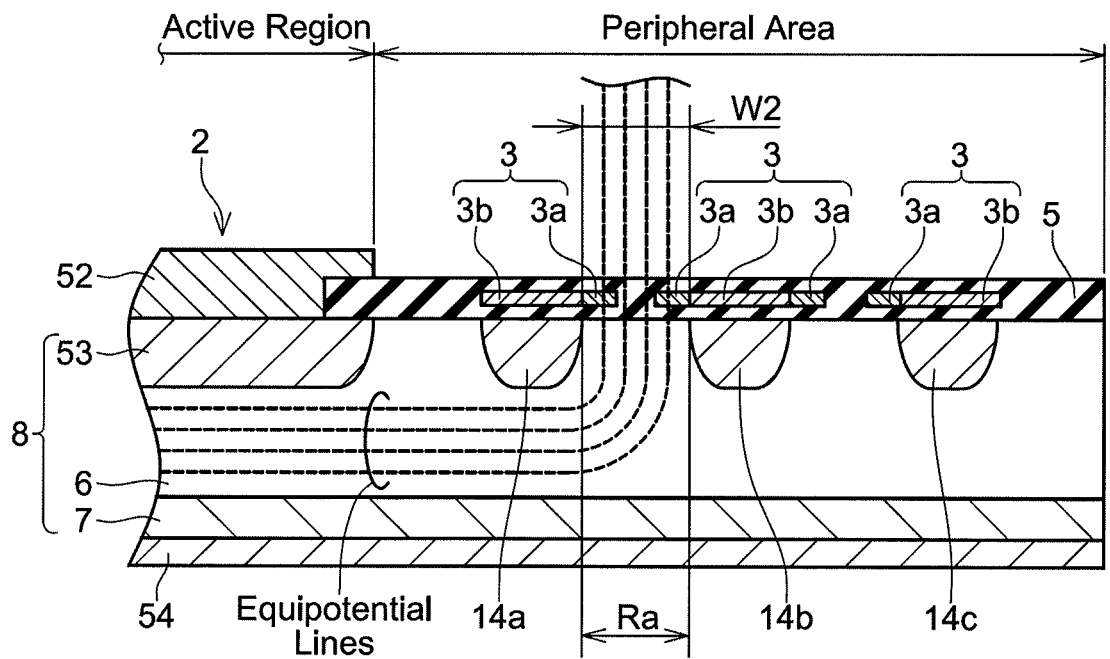
FIG. 1B is a sectional view of a semiconductor device (showing equipotential lines at a high voltage)
Figure 2:
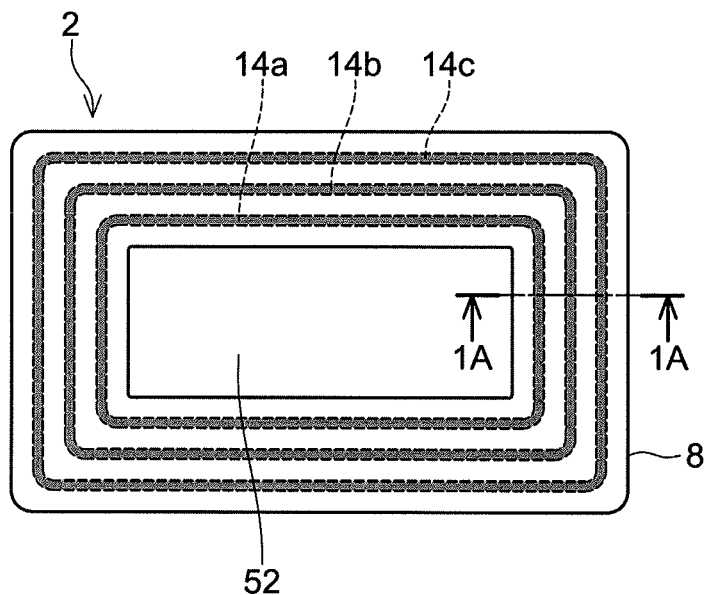
FIG. 2 is a plan view of a semiconductor device.

A first embodiment of a semiconductor device disclosed in the present specification will be described, with reference to the attached drawings. A semiconductor device 2 according to the first embodiment is a device that includes a transistor. Each of FIG. 1A and FIG. 1B is a sectional view of the semiconductor device 2 according to the first embodiment. FIG. 1A and FIG. 1B have already been described above. FIG. 2 is a plan view of the semiconductor device 2. The reference numeral 52 indicates a first main electrode. The first main electrode 52 is one of the electrodes of the transistor, and an region indicated by the first main electrode 52 in the plan view corresponds to an "active region". In other words, the active region is where the first main electrode 52 occupies in the plan view of a substrate 8. The semiconductor device 2 has an element (transistor) formed in the active region. In the plan view, the area surrounding the active region is called a peripheral area. The semiconductor device 2 has three FLRs (field limiting rings) in the peripheral area. The FLRs are covered with an insulation layer 5 (see FIG. 1A) and, for that reason, the FLRs are shown with dashed lines in FIG. 2. In FIG. 2, the FLRs are shown in gray for the sake of clarity. As described above, the FLRs are sometimes called a first FLR 14a, a second FLR 14b, and a third FLR 14c, in this order from the innermost one in the plan view. In the plan view, the plurality of FLRs 14 surrounds the active region. The FLRs 14 are formed in the substrate and has their top surfaces covered with the insulation layer 5. As described above, within the insulation layer 5 and along each FLR, a semiconductor layer 3 is formed. Accordingly, although not shown in FIG. 2, three semiconductor layers 3 surround the active region in the plan view.

Figure 3:
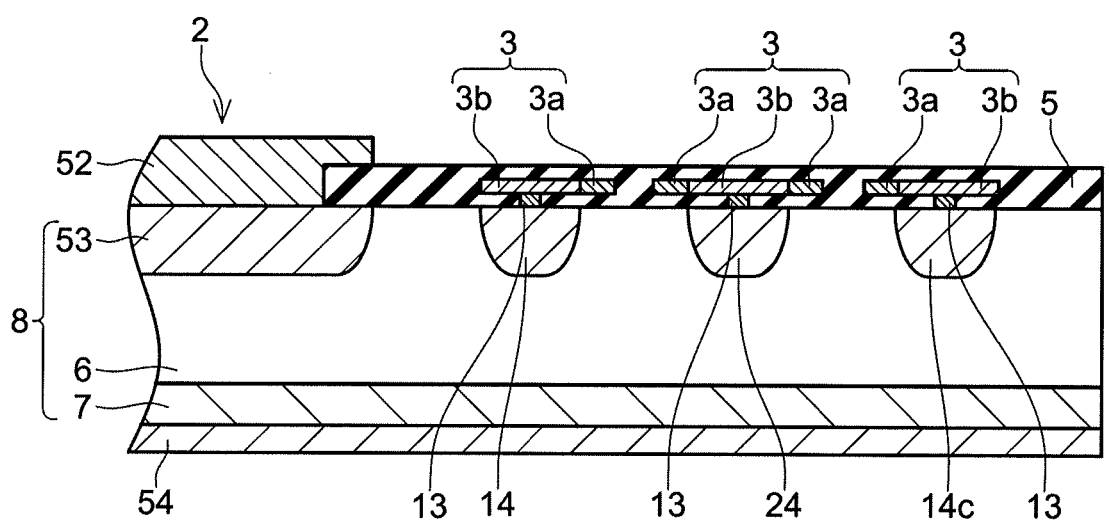
FIG. 3 is a sectional view of a semiconductor layer taken from a different plane.

FIG. 3 is a sectional view of the semiconductor device 2 taken from a different plane. Each semiconductor layer 3 facing an FLR is electrically connected with the corresponding FLR 14 by a conductor 13. The conductors 13 do not continuously surround the active region in the plan view but connect the FLRs 14 with the semiconductor layers 3 in places. Each semiconductor layer 3 and its facing FLR 14 are equal in potential. Because of this, no electric field is formed between the FLR 14 and the semiconductor layer 3 above the FLR 14. Therefore, as shown in FIG. 1A and FIG. 1B, the electric field extending from a depletion layer formed in a drift layer 6 passes between adjacent FLRs (the first FLR 14a and the second FLR 14b).

The structures and the functions of the FLRs 14 and the facing semiconductor layers 3 of the semiconductor device 2 have already been described above, and therefore description will not be repeated here.

Figure 4:
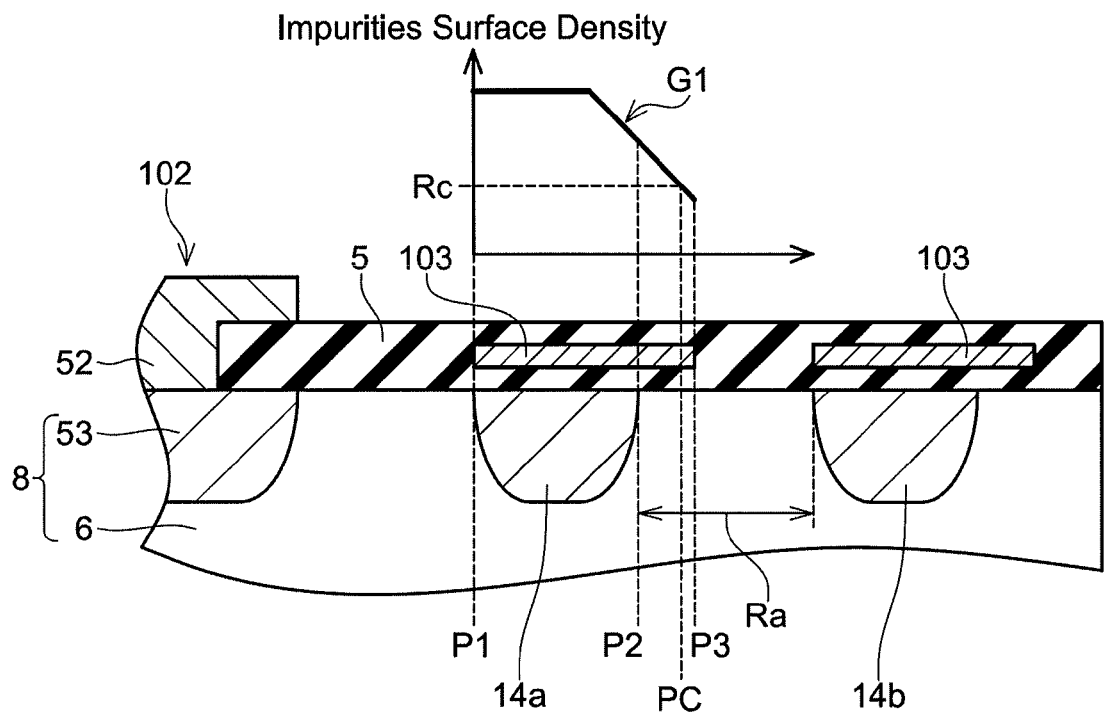
FIG. 4 is an enlarged sectional view accompanied by an example of distribution of impurities throughout a semiconductor layer.
Figure 5:
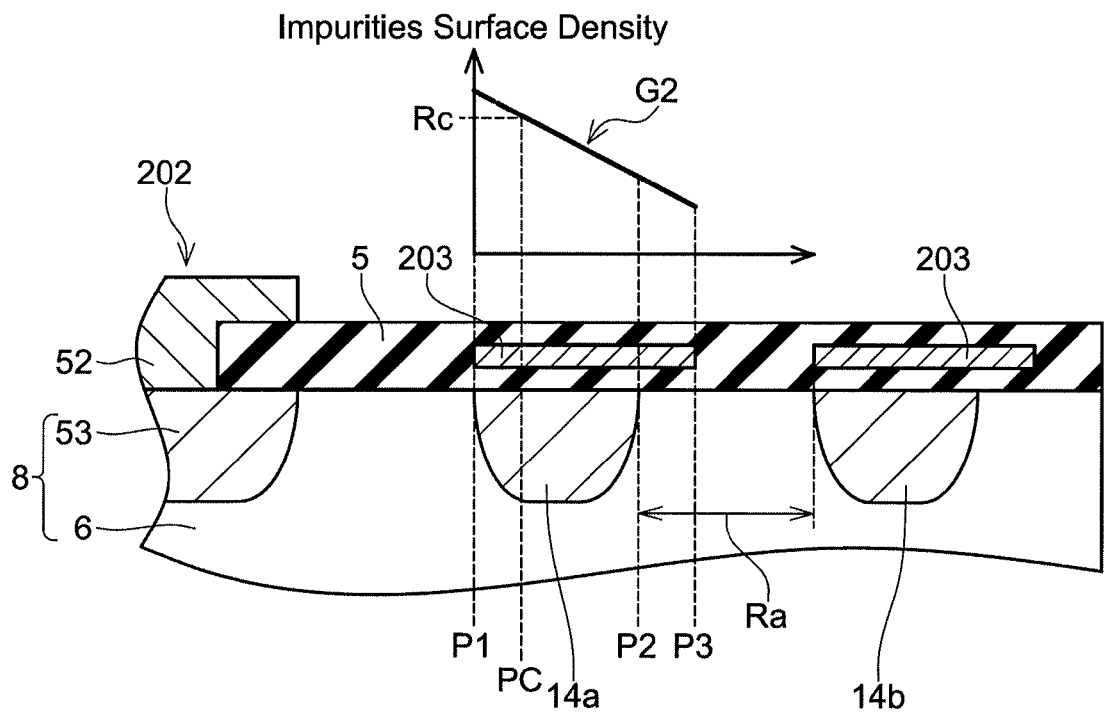
FIG. 5 is an enlarged sectional view accompanied by another example of distribution of impurities throughout a semiconductor layer.

The following describes a variation of the semiconductor device 2 according to the first embodiment, with reference to FIG. 4 and FIG. 5. In the semiconductor device 2 shown in FIG. 1A to FIG. 3, the high surface density region 3b and the low surface density region 3a of each semiconductor layer 3 are clearly separated. The surface density of impurities may gradually decrease from the high surface density region to the low surface density region. FIG. 4 is an enlarged sectional view of a semiconductor device 102 that has semiconductor layers, and each semiconductor layer has a surface density that gradually changes. FIG. 5 is an enlarged sectional view of a semiconductor device 202 that has semiconductor layers having another surface density distribution. Each of FIG. 4 and FIG. 5 is an enlarged view of two FLRs (the first FLR 14a and the second FLR 14b) and the vicinity thereof. The part not shown in FIG. 4 or FIG. 5 is the same as in the semiconductor device 2 in FIG. 1A.

FIG. 4 includes a surface density graph G1 shown above a semiconductor layer 103. In the surface density graph G1, the ordinate indicates the surface density of impurities contained in the semiconductor layer 103, while the abscissa indicates the position of the impurities in the semiconductor layer 103. A position P1 corresponds to the inner end of the semiconductor layer 103, while a position P3 corresponds to the outer end of the semiconductor layer 103. Herein, the side closer to the active region is called an "inner" side, while the side farther from the active region is called an "outer" side. The region occupied by a first main electrode 52 corresponds to the active region. The position P1 also corresponds to the inner end of the first FLR 14a. A position P2 corresponds to the outer end of the first FLR 14a. The semiconductor layer 103 faces the first FLR 14a and extends farther into an area above an inter-ring region Ra that surrounds the first FLR 14a.

The surface density of impurities in the semiconductor layer 103 is high in the inner side and decreases toward the outer side. In the graph G1, the reference numeral Rc indicates a RESURF surface density. The reference numeral PC indicates the position at which the surface density of impurities is equal to the RESURF surface density Rc. In the semiconductor layer 103, the region where the surface density of impurities is higher than the RESURF surface density extends beyond the portion facing the first FLR 14a and then, somewhere in the inter ring region Ra, the surface density of impurities becomes lower than the RESURF surface density Rc. In other words, the position PC is located between the position P2 and a position P3.

FIG. 5 shows an example of a semiconductor layer 203 that has another surface density distribution. Distribution of the surface density of impurities in the semiconductor layer 203 of the semiconductor device 202 also gradually decreases from the inner side to the outer side. In the semiconductor layer 203, however, a position PC corresponding to the RESURF surface density Rc is within a portion facing the first FLR 14a. In other words, in the semiconductor layer 103 of the semiconductor device 102 in FIG. 4, the width of the low surface density region where the surface density of impurities is lower than the RESURF surface density Rc is small, while in the semiconductor layer 203 of the semiconductor device 202 in FIG. 5, the width of the low surface density region is great. Therefore, the semiconductor device 102 has small effect to enhance dielectric strength but has great effect to trap movable ions compared to the semiconductor device 202, while the semiconductor device 202 has great effect to enhance dielectric strength but has small effect to trap movable ions compared to the semiconductor device 102. In either of the semiconductor layers having a surface density of impurities gradually decreasing from the inner side to the outer side, a portion facing the FLR includes at least part of the region (the high surface density region) where the surface density of impurities is higher than the RESURF surface density Rc, and an end part of the inter-ring region includes at least part of the region (the low surface density region) where the surface density of impurities is lower than the RESURF surface density Rc. In either of the semiconductor layers, the surface density may change step-wise from the high surface density region to the low surface density region as shown in FIG. 1A, or may change gradually from the high surface density region to the low surface density region as shown in FIG. 4 and FIG. 5. In either of the semiconductor layers, the high surface density region is simply required to partly constitute the portion facing the FLR, and the surface density of impurities is not necessarily required to be higher than the RESURF surface density throughout the entire portion facing the FLR. Similarly, in either of the semiconductor layers, the low surface density region is simply required to constitute an end part of a portion lying over the inter-ring region, and the surface density is not necessarily required to be lower throughout the entire portion lying over the inter-ring region.

Second Embodiment

Figure 6A:
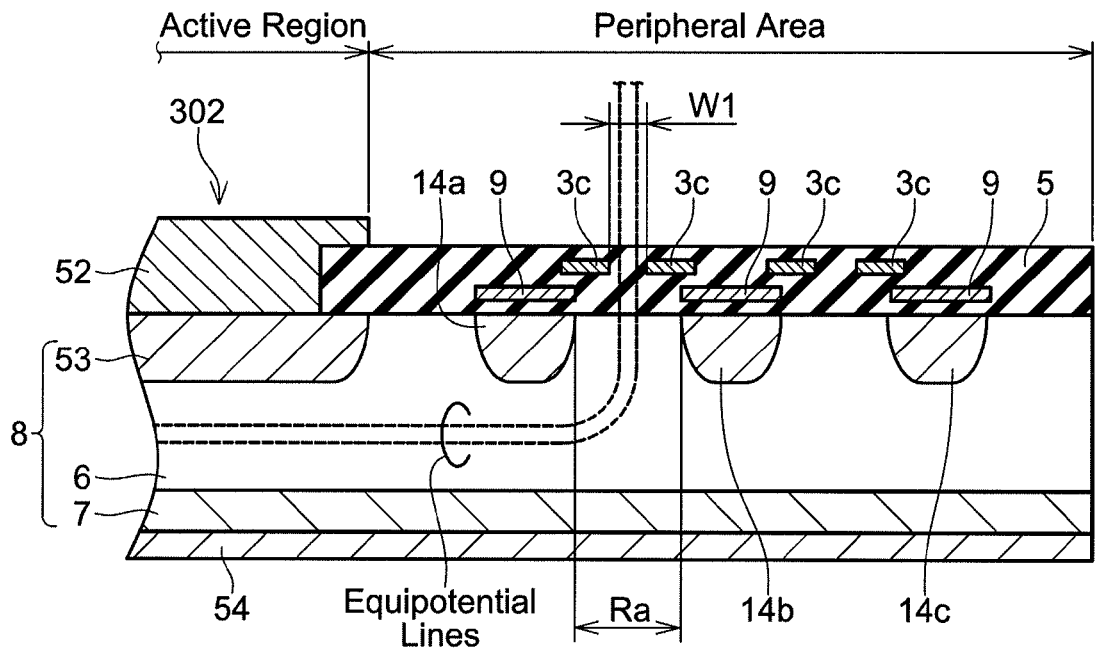
FIG. 6A is a sectional view of a semiconductor device according to a second embodiment (showing equipotential lines at a low voltage)
Figure 6B:
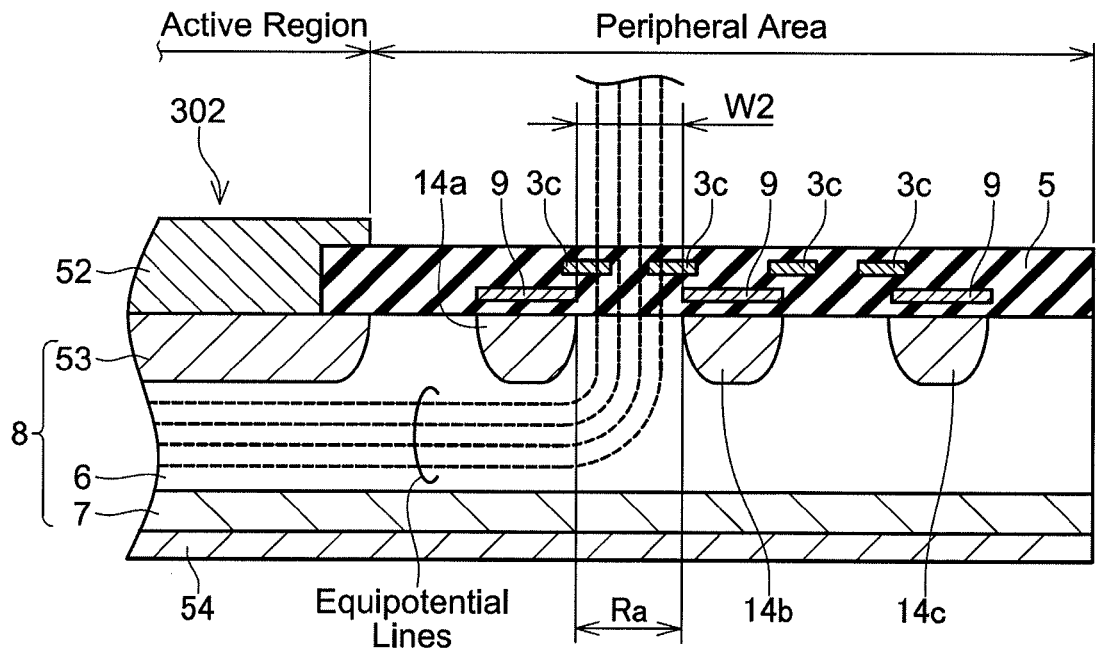
FIG. 6B is a sectional view of a semiconductor device according to a second embodiment (showing equipotential lines at a high voltage)
Figure 7:
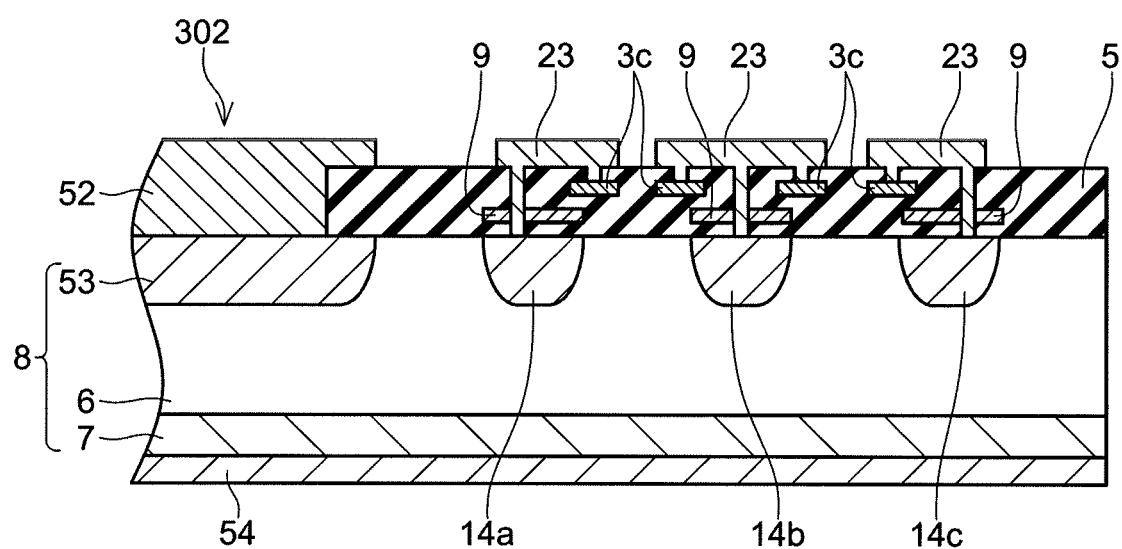
FIG. 7 is a sectional view of a semiconductor device according to a second embodiment, taken from a different plane.

The following describes a semiconductor device 302 according to a second embodiment, with reference to FIGS. 6A and 6B and FIG. 7. The semiconductor device 302 has an insulation layer 5. Inside the insulation layer 5, at least one semiconductor layer 3c having a uniform surface density is present along with at least one conductive layer 9, instead of a semiconductor layer in which surface density changes being present. The semiconductor layer 3c and the conductive layer 9 face an FLR. Each conductive layer 9 faces a corresponding FLR. Although, the drawings do not show, each conductive layer 9 surrounds an active region along with the FLR. Some parts in FIG. 6A to FIG. 7 that are also provided to the semiconductor device 2 in FIG. 1A have the same reference numerals as in FIG. 1A. Description of such parts that are also provided to the semiconductor device 2 is omitted.

In the plan view of a substrate 8, a part of each semiconductor layer 3c overlaps with a conductive layer 9 and an FLR 14. Another part of the semiconductor layer 3c overlaps with an inter-ring region Ra next to the FLR 14. In other words, in the width direction, the semiconductor layer 3c is closer to the adjacent FLR (a second FLR 14b, for example) than an edge of the corresponding FLR (a first FLR 14a, for example) is, and is closer to the adjacent FLR than an edge of the corresponding conductive layer 9 is.

FIG. 6A, like FIG. 1A, shows equipotential lines that pass through a depletion layer when a low voltage is applied across main electrodes 52 and 54. FIG. 6B, like FIG. 1B, shows equipotential lines that pass through the depletion layer when a high voltage is applied. The semiconductor layers 3c contain impurities at a surface density lower than the RESURF surface density and therefore, when a high voltage is applied, the depletion layer expands thereinto. The width of the depletion layer varies depending on the voltage. When the voltage is low, the width of the depletion layer is small. When the voltage is extremely low, substantially no depletion layer is formed in the semiconductor layer 3c (FIG. 6A). Because each semiconductor layer 3c contains carriers throughout the semiconductor layer 3c, the entire semiconductor layer 3c is equal in potential. Therefore, no electric field is formed in the semiconductor layers 3c. Because of this, in each inter-ring region Ra, the electric field extending from the depletion layer formed in a drift layer 6 is present only where no semiconductor layer 3c is present (within a range W1 shown in FIG. 6A). In other words, the equipotential lines indicating the depletion layer formed in the drift layer 6 pass through each range W1 that is between adjacent FLRs and where the semiconductor layer 3c is not present, but cannot pass through the semiconductor layer 3c.

When a high voltage is applied across the main electrodes 52 and 54, a depletion layer is formed and expands in the semiconductor layers 3c. In the depletion layer, no carrier is present and therefore an electric field can be formed. As a result, in each inter-ring region Ra, the electric field extending from the depletion layer formed in the drift layer 6 expands in each range W2 where the semiconductor layer 3c is present (but no conductive layer 9 is present) (FIG. 6B). As the voltage increases, the width of the area in the inter-ring region Ra where an electric field can be formed increases, reducing electric field strength and enhancing dielectric strength.

When a low voltage is applied, movable ions are trapped in the conductive layers 9 and the semiconductor layers 3c. When the voltage increases, a depletion layer is formed and expands in the semiconductor layers 3c and, as a result, only the conductive layers 9 trap the movable ions. As long as the voltage is low, the movable ions can be trapped in a large area and accordingly deterioration of the insulation layer 5 due to the movable ions can be reduced.

FIG. 7 is a sectional view of the semiconductor device 302, taken from a different plane. In the cross section in FIG. 7, each FLR 14 is electrically connected by an electrode 23 with a conductive layer 9 corresponding to the FLR 14 and semiconductor layer(s) 3c corresponding to the FLR 14. Namely, the FLR 14, the conductive layer 9 corresponding to the FLR 14, and the semiconductor layer(s) 3c corresponding to the FLR 14 are equal in potential. Therefore, no electric field is formed between the FLR 14 and the conductive layer 9 and between the conductive layer 9 and the semiconductor layer(s) 3c. Accordingly, the electric field extending from the depletion layer formed in the drift layer 6 always passes through a region between adjacent FLRs (an inter-ring region Ra) without exception.

Each electrode 23 does not necessarily surround the active region in the plan view of the substrate 8. Each electrode 23 is simply required to be electrically connected with an FLR, a conductive layer, and a semiconductor layer in places around the active region. Alternatively, each electrode 23 may continuously surround the active region in the plan view of the substrate.

Figure 8A:
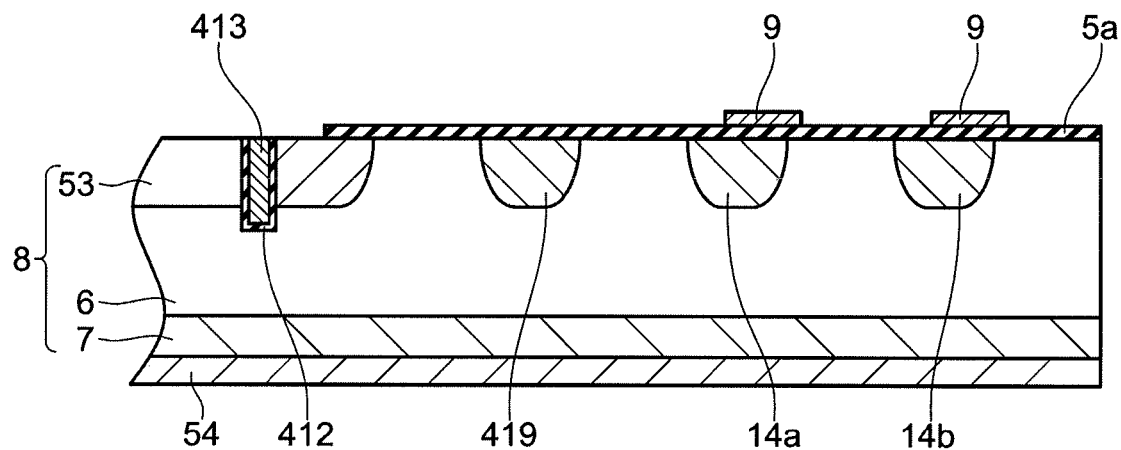
FIG. 8A shows a diagram (1) of a method of manufacturing a semiconductor device.

Next, a method of manufacturing a semiconductor device is described with reference to FIGS. 8A to 8D. A semiconductor device 402 is an IGBT (Insulated Gate Bipolar Transistor) having a diode for sensing the temperature of an element. FIG. 8A shows a step to form a gate. Before the step shown in FIG. 8A, an N(+)-type collector layer 7, a second main electrode 54 in contact with the collector layer 7, a P(+)-type body layer 53, a gate trench 412, a first FLR 14a, a second FLR 14b, and a temperature-sensing P(+)-type layer 419 have already been formed on an N(-)-type substrate 8.

These layers can be formed by a conventional method, and therefore description thereof is omitted.

FIG. 8A shows a step to form a gate 413. The gate 413 of the IGBT according to this embodiment is composed of the trench 412 filled with polysilicon. The polysilicon here has an adequate surface density of impurities to function as a conductor. Simultaneously when the trench 412 is filled with polysilicon, the same polysilicon is used to form a conductive layer 9 above each of the first FLR 14a and the second FLR 24a. Both of the conductive layer 9 and the gate are formed of conductive polysilicon.

Figure 8B:
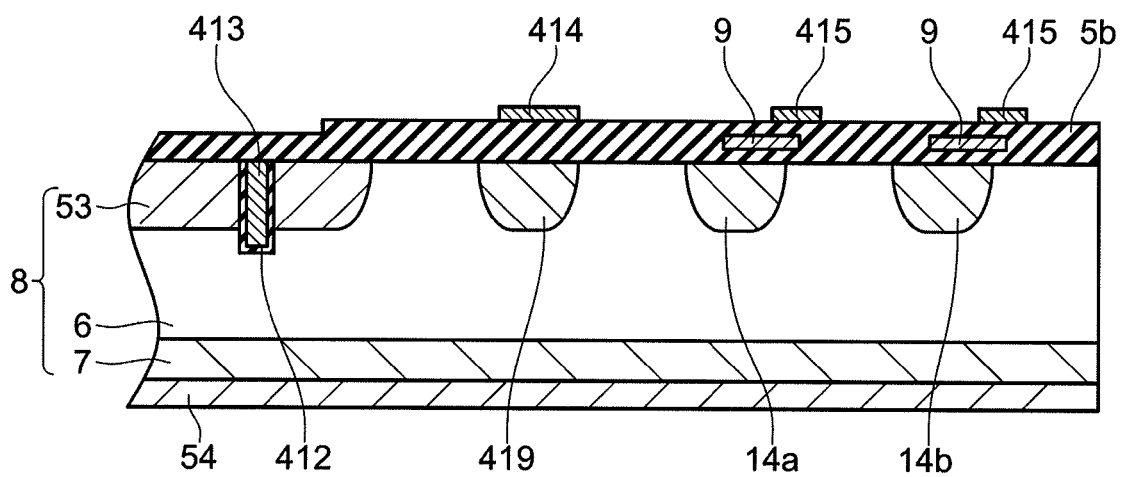
FIG. 8B shows a diagram (2) of the method of manufacturing a semiconductor device.

Subsequently, a main surface is overlaid with an insulation layer (an insulation layer 5b) and, on the resulting insulation layer 5b, a polysilicon layer 414 as a base of a temperature-sensing diode and polysilicon layers 415 as a base of semiconductor layers are formed (FIG. 8B). The polysilicon layer 414 as the base of the temperature-sensing diode and the polysilicon layers 415 as the base of the semiconductor layers are formed of the same material. The doping type of the polysilicon here is an N(-) type. The polysilicon layer 414 as a base of a temperature-sensing diode is formed above the temperature-sensing P(+)-type layer 419. The polysilicon layers 415 as the base of the semiconductor layers are formed so that a part of each polysilicon layer 415 overlaps with the corresponding conductive layer 9. Namely, simultaneously with formation of the polysilicon layer 414 as the base of the temperature-sensing element on the substrate 8, the polysilicon layers 415 as the base of the semiconductor layers are formed on the substrate 8.

Then, about half of the polysilicon layer 414 is doped with P-type impurities, while the rest is doped with N-type impurities. As a result, the polysilicon layer 414 becomes a diode 414a. Simultaneously with this step, the polysilicon layers 415 as the base of the semiconductor layers are doped with impurities at a desired surface density. For example, as in the case of a semiconductor layer 3c of the semiconductor device 302 shown in FIG. 6A, P-type impurities are used for doping to achieve a surface density lower than the RESURF surface density. As a result, the polysilicon layers 415 become the semiconductor layers 3.

Figure 8C:
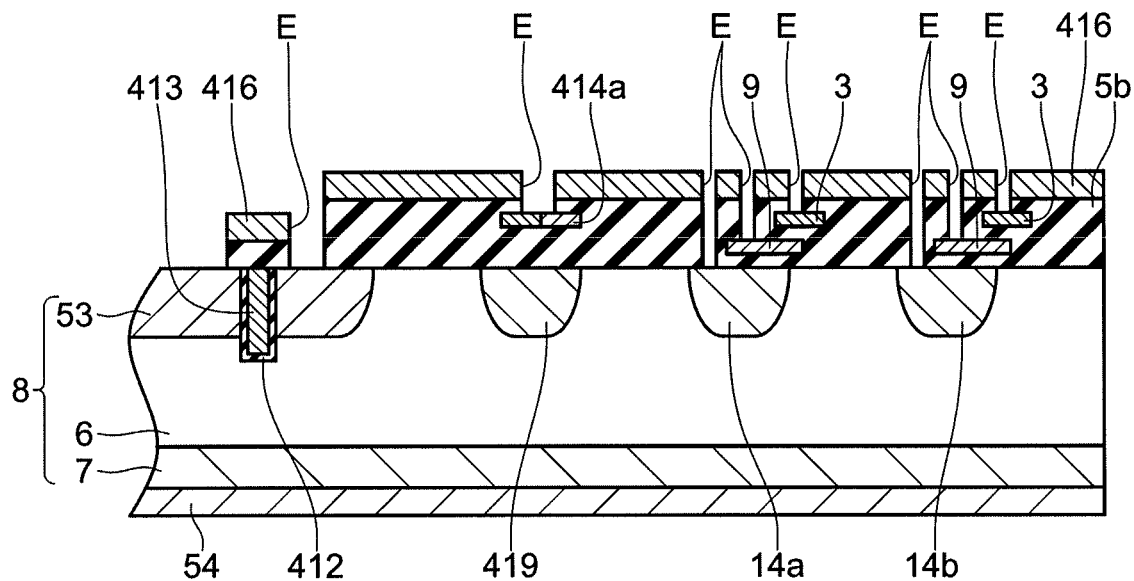
FIG. 8C shows a diagram (3) of the method of manufacturing a semiconductor device.

Subsequently, a resist 416 is formed, and unnecessary insulation layer is removed (FIG. 8C). Grooves with the reference numeral E in FIG. 8C indicate a part of the insulation layer 5b to be removed by etching. In this method, the insulation layer 5b is removed so as to expose part of the diode 414a, and the insulation layer 5b is further removed so as to expose part of each FLR 14, part of each conductive layer 9, and part of each semiconductor layer 3.

Figure 8D:
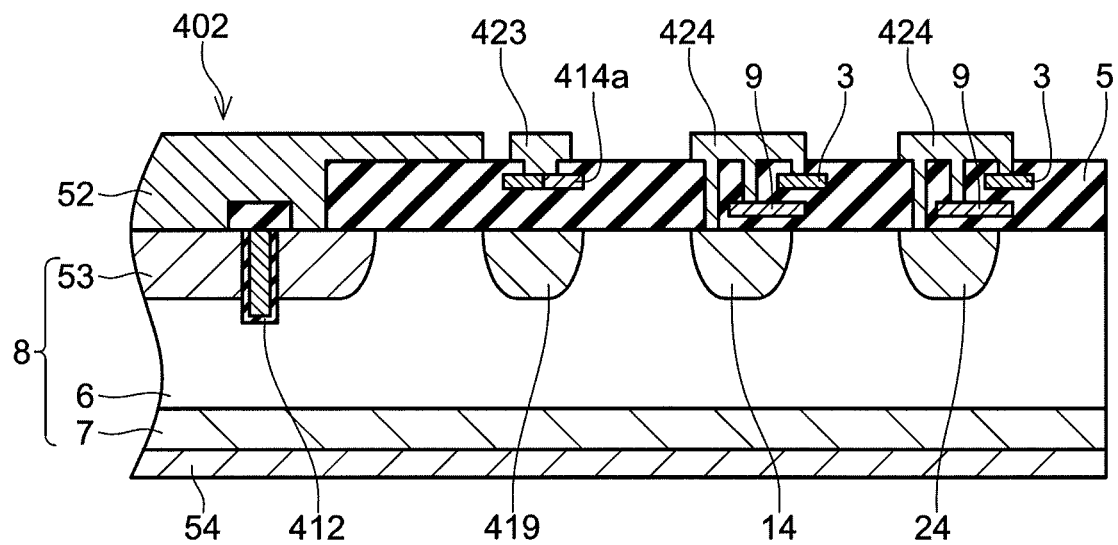
FIG. 8D shows a diagram (4) of the method of manufacturing a semiconductor device.

Lastly, a conductive polysilicon layer is formed in these spaces that have been subjected to removal (FIG. 8D). The conductive polysilicon layer constitutes a first main electrode 52, an electrode 423 of the temperature-sensing diode, and an electrode 424 of each FLR. The electrode 424 of each FLR electrically connects the FLR (the first FLR 14, the second FLR 24) with the corresponding conductive layer 9 and the corresponding semiconductor layer 3.

In this method, the conductive layers 9 and the semiconductor layers 3 are formed in the IGBT having a temperature-sensing diode 414a, through conventional steps. Therefore, no additional step for forming the conductive layers 9 and the semiconductor layers 3 is required.

Third Embodiment

Figure 9:
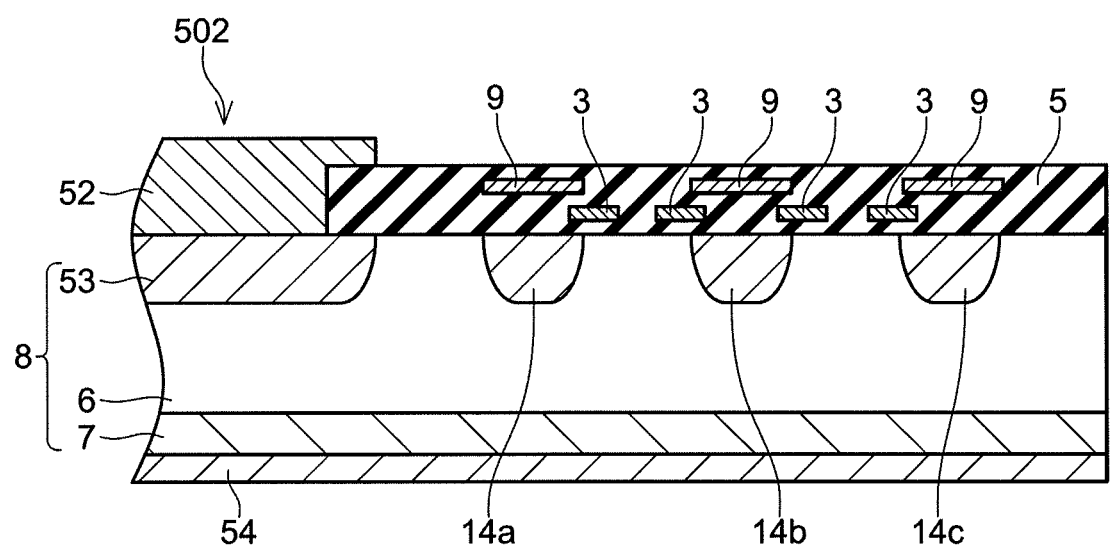
FIG. 9 is a sectional view of a semiconductor device according to a third embodiment.

The following describes a semiconductor device 502 according to a third embodiment, with reference to FIG. 9. The semiconductor device 502 has a structure similar to the structure of the semiconductor device 302 according to the second embodiment described above. In the semiconductor device 302 according to the second embodiment, the conductive layer 9 was provided near each FLR 14 and, above each conductive layer 9, the semiconductor layer 3 was provided. In the semiconductor device 502 according to this embodiment, each semiconductor layer 3 is provided near an FLR 14 and, above each semiconductor layer 3, a conductive layer 9 is provided. Namely, the vertical relation between the conductive layers 9 and the semiconductor layers 3 of the semiconductor device 302 is opposite to the one in the semiconductor device 502. The semiconductor device 502 has the same advantages as the advantages of the semiconductor device 302.

Figure 10:
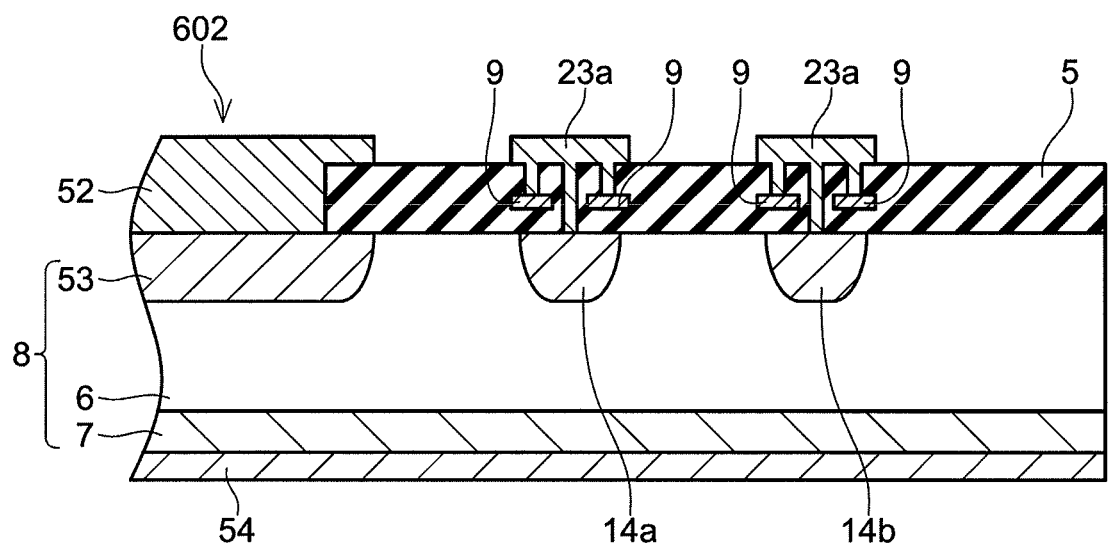
FIG. 10 is a sectional view showing an example of a structure where an FLR and a conductive layer are electrically connected with each other.
Figure 11:
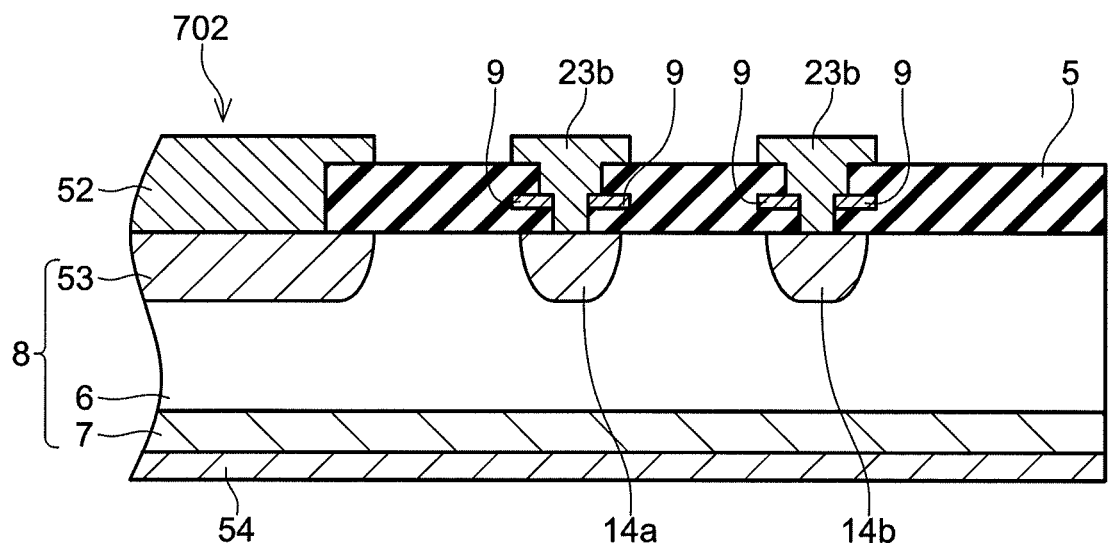
FIG. 11 is a sectional view showing another example of a structure where an FLR and a conductive layer are electrically connected with each other.
Figure 12:
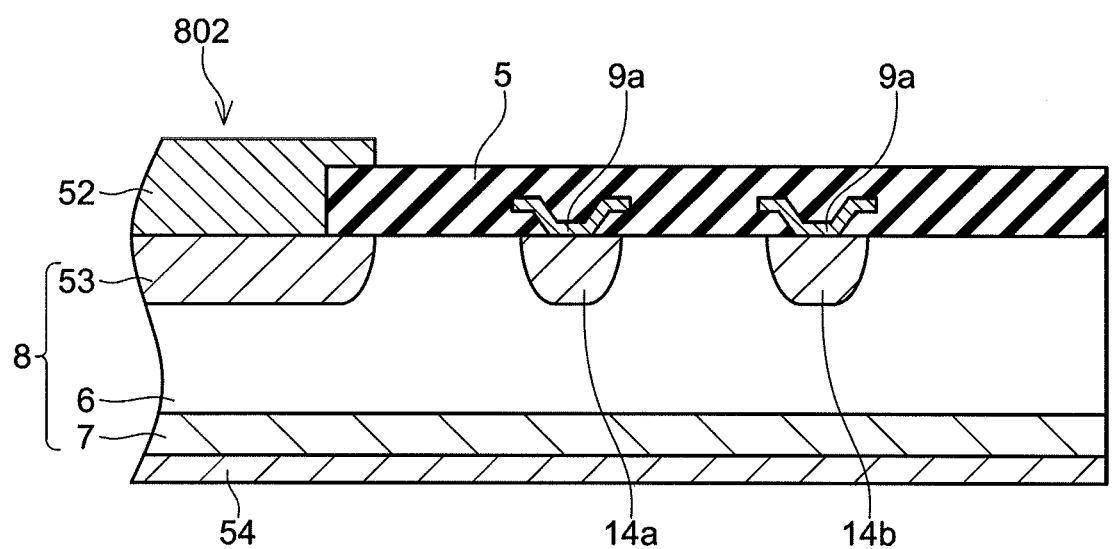
FIG. 12 is a sectional view showing yet another example of a structure where an FLR and a conductive layer are electrically connected with each other.

The following describes alternative structures to electrically connect FLRs 14 with conductive layers 9, with reference to FIG. 10 to FIG. 12. In a semiconductor device 602 in FIG. 10, trenches that communicate with an FLR 14 and a pair of conductive layers 9 are formed in an insulation layer 5. Then, each trench is filled with a conductor. The filled conductor corresponds to an electrode 23a that electrically connects each FLR 14 with its conductive layer 9. In a semiconductor device 702 in FIG. 11, a thick trench that cuts through a conductive layer 9 to reach an FLR 14 is formed. Then, the trench is filled with a conductor. The filled conductor corresponds to an electrode 23b. The conductive layer 9 is in contact with side surfaces of the electrode 23b, and the FLR 14 is in contact with the bottom surface of the electrode 23b.

In a semiconductor device 802 in FIG. 12, conductive layers 9a with their center area bending downwardly are formed. The bent area of each conductive layer 9a is in contact with an FLR 14. The semiconductor device 802 has an advantage that no electrode for electrically connecting a conductive layer 9a with an FLR 14 is required.

Figure 13:
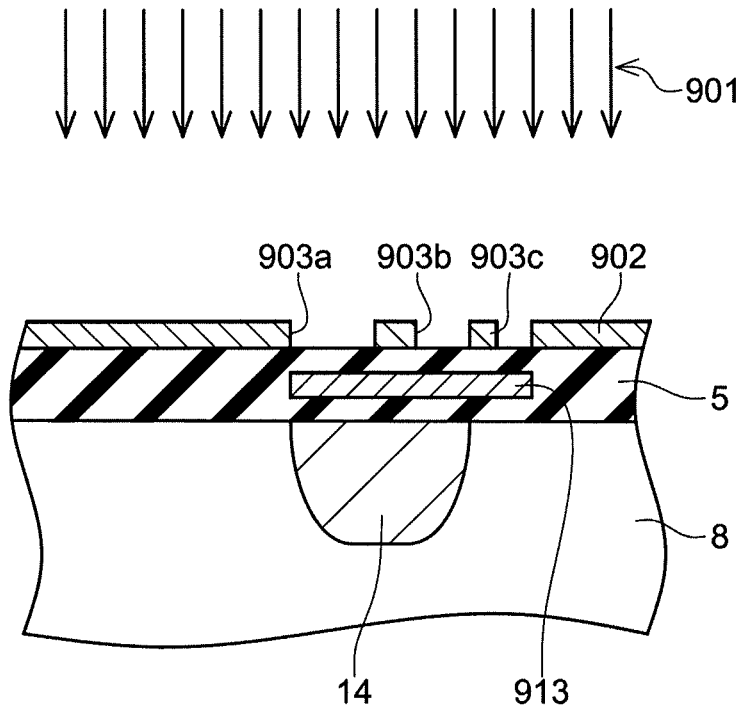
FIG. 13 is a sectional view describing an example of a method of manufacturing a semiconductor layer that has a surface density gradient.
Figure 14:
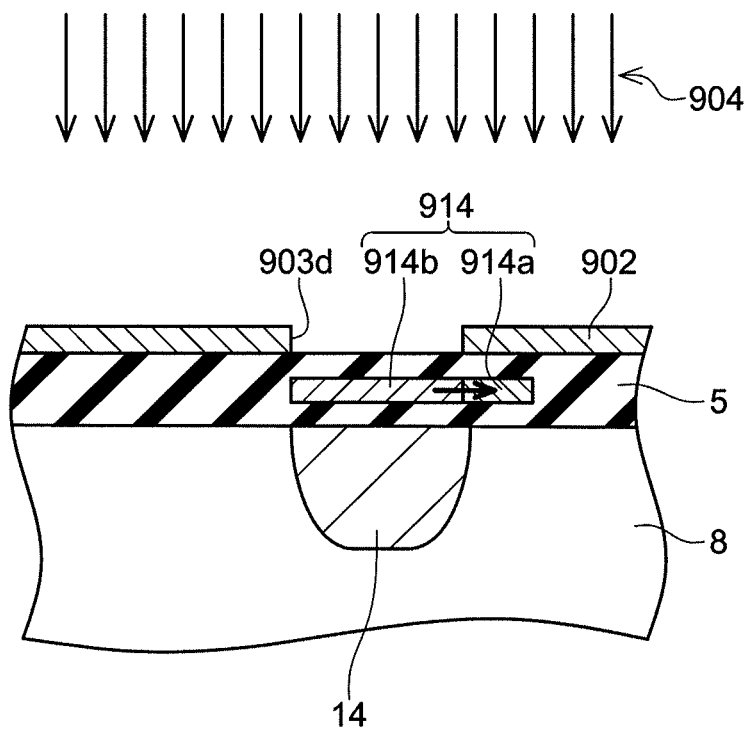
FIG. 14 is a sectional view describing another example of a method of manufacturing a semiconductor layer that has a surface density gradient.

The following describes an example of a method of manufacturing a semiconductor layer that has a surface density gradient, with reference to FIG. 13 and FIG. 14. In the method shown in FIG. 13, a resist layer 902 is formed on a top surface of an insulation layer 5 that has a semiconductor layer 913 inside. The resist layer is partly removed to form a plurality of openings (openings 903a, 903b, and 903c) through which a semiconductor layer 3 is to be exposed. The width of each opening is selected depending on the desired distribution of the surface density of impurities. Namely, a largest opening 903a is formed where impurities to be provided through the opening should achieve a highest surface density, a smallest opening 903c is formed where impurities to be provided through the opening should achieve a smallest surface density, and a medium-sized opening 903b is formed where impurities to be provided through the opening should achieve a medium surface density. Then, impurities 901 of a P-type or an N-type is used for doping. As a result, a semiconductor layer 3 having a surface density of impurities in accordance with the size of the opening is obtained. In the semiconductor layer obtained by the method shown in FIG. 13, the surface density of impurities is high at the left end and decreases progressively toward the right.

In the method shown in FIG. 14, a chemical element with a low diffusion coefficient is used for doping. Examples of the chemical element with a low diffusion coefficient include arsenic (As), antimony (Sb), and indium (In). In the method shown in FIG. 14, a resist layer 902 is formed on a top surface of an insulation layer 5 that has a semiconductor layer 914 inside. Then, the resist layer above the region that should achieve a high surface density of impurities is removed, whereby an opening 903d is formed. Subsequently, a chemical element 904 with a low diffusion coefficient is used for doping. The region where impurities have been directly doped constitutes a region that contains impurities at a high surface density (a high surface density region 914b). The impurities used have a low diffusion coefficient. Therefore, the impurities diffuse within the semiconductor layer 914 from the high surface density region 914b to the area where no impurities reach due to the presence of the resist 902. In FIG. 14, the arrow shown within the semiconductor layer 914 indicates diffusion of the impurities. Thus, the region covered with the resist 902 becomes a low surface density region 914a.

The following describes some points of attention to note about the techniques described in the embodiment section. Desirably, the FLR 14, the semiconductor layer 3 corresponding to the FLR 14, and the conductive layer 9 corresponding to the FLR 14 are electrically connected with each other. Preferably, in the plan view of the substrate, an electrode that electrically connects an FLR 14 with a semiconductor layer 3 and an electrode that electrically connects an FLR with a conductive layer 9 continuously surround an active region along with FLRs.

Representative, non-limiting, specific embodiments of the present invention have been described above in detail with reference to the attached drawings. The detailed description above has been provided for the purpose of merely teaching the details required to carry out preferable embodiments of the present invention to a person skilled in the art, and has not been intended to limit the scope of the present invention. The additional characteristics and inventions disclosed herein can be used independently of or in combination with other characteristics and inventions so as to provide a semiconductor device having further improvement and a method of producing the same.

The combinations of characteristics and steps disclosed in the detailed description above are not essential for carrying out the present invention in its broadest reasonable construction but are given for the purpose of merely describing, in particular, the representative, specific examples of the present invention. Besides, the various characteristics of the representative, specific examples and the various characteristics of the matters described in the independent claims and the dependent claims are not necessarily required to be combined in the same way or in the same order as in the specific examples when providing additional and useful embodiments of the present invention.

All the characteristics described in the present specification and/or in the claims have been disclosed separately and independently of each other for the same purpose as the purpose of the disclosure at the time of filing of the application and for the purpose of restricting the claimed subject matter, independent of the composition of the characteristics described in the embodiments and/or in the claims. In addition, description regarding any numerical range, any group, and any collection are given so as to disclose every possible intermediate value or intermediate entity for the same purpose as the purpose of the disclosure at the time of filing of the application and for the purpose of restricting the claimed subject matter.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising:
   a plurality of field limiting rings surrounding, in a plan view of a substrate of the semiconductor device, an active region in which a semiconductor element is formed;
   an insulation layer provided on a main surface of the substrate, and covering the plurality of field limiting rings; and
   a semiconductor layer provided in the insulation layer, the semiconductor layer surrounding the active region in the plan view and being in parallel with the plurality of field limiting rings,
   wherein
   the semiconductor layer contains impurities at a surface density lower than a surface density of a RESURF condition, and
   the semiconductor layer overlaps, in the plan view, with a portion of a region (an inter-ring region) between adjacent field limiting rings, and does not overlap with rest of the inter-ring region.

2. The semiconductor device according to claim 1, wherein
   in the plan view, the semiconductor layer faces one of the plurality of field limiting rings and extends above the inter-ring region which is adjacent to the one of the plurality of field limiting rings,
   a portion of the semiconductor layer overlapped with the inter-ring region in the plan view includes a low surface density region which contains the impurities at a surface density lower than the surface density of the RESURF condition, and
   a portion of the semiconductor layer facing the one of the plurality of field limiting rings includes a high surface density region which contains the impurities at a surface density higher than the surface density of the RESURF condition.

3. The semiconductor device according to claim 2, wherein the semiconductor layer is electrically connected with the one of the plurality of field limiting rings.

4. The semiconductor device according to claim 1 further comprising:
   a conductive layer provided in the insulation layer, the conductive layer facing one of the plurality of field limiting rings, and surrounding the active region,
   wherein
   the semiconductor layer extends closer to the adjacent field limiting ring than an edge of the one of the plurality of field limiting rings, and extends closer to the adjacent field limiting ring than the conductive layer.

5. The semiconductor device according to claim 4, wherein the one of the plurality of field limiting rings, the semiconductor layer, and the conductive layer are electrically connected.

6. A manufacturing method of a semiconductor device of claim 4, the method comprising:
   forming the conductive layer concurrently as forming a trench gate on the substrate; and
   forming a polysilicon layer which becomes a base of the semiconductor layer concurrently as forming a polysilicon layer which becomes a base of a temperature sensing element on the substrate.

* * * * *